United States Patent [19]

Debe

[11] Patent Number: 5,336,558
[45] Date of Patent: Aug. 9, 1994

[54] COMPOSITE ARTICLE COMPRISING ORIENTED MICROSTRUCTURES

[75] Inventor: Mark K. Debe, Stillwater, Minn.

[73] Assignee: Minnesota Mining and Manufacturing Company, St. Paul, Minn.

[21] Appl. No.: 720,188

[22] Filed: Jun. 24, 1991

[51] Int. Cl.$^5$ .............................................. B32B 5/16
[52] U.S. Cl. ................................. 428/323; 428/327; 428/357; 428/378; 428/409
[58] Field of Search ............... 428/323, 327, 378, 409, 428/411.1, 357, 149, 143, 179, 325; 156/247; 204/192.14, 192.26; 427/255.6

[56] References Cited

U.S. PATENT DOCUMENTS

| | | | |
|---|---|---|---|
| 3,220,897 | 11/1965 | Conley et al. | 148/34 |
| 3,293,109 | 12/1966 | Luce et al. | 161/166 |
| 3,585,010 | 6/1971 | Luce et al. | 29/191.2 |
| 3,969,545 | 7/1976 | Slocum | 427/163 |
| 4,002,541 | 1/1977 | Streander | 204/33 |
| 4,148,294 | 4/1979 | Scherber et al. | 126/270 |
| 4,155,781 | 5/1979 | Diepers | 148/175 |
| 4,209,008 | 6/1980 | Lemkey et al. | 126/452 |
| 4,215,170 | 7/1980 | Oliva | 428/328 |
| 4,252,843 | 2/1981 | Dorer | 427/162 |
| 4,252,865 | 2/1981 | Gilbert et al. | 428/611 |
| 4,340,276 | 7/1982 | Maffitt et al. | 350/164 |
| 4,396,643 | 8/1983 | Kuehn et al. | 427/160 |
| 4,410,565 | 10/1983 | Kitamoto et al. | 427/130 |
| 4,560,603 | 12/1985 | Giacomel | 428/86 |
| 4,568,598 | 2/1986 | Bilkadi et al. | 428/141 |
| 4,588,656 | 5/1986 | Kitamoto et al. | 428/694 |
| 4,678,695 | 7/1987 | Tung et al. | 428/120 |
| 4,774,122 | 9/1988 | Adler | 428/156 |
| 4,812,352 | 3/1989 | Debe | 428/142 |
| 4,908,258 | 5/1990 | Hernandez | 428/198 |

FOREIGN PATENT DOCUMENTS

| | | | |
|---|---|---|---|
| 0070102 | 1/1983 | European Pat. Off. | G03F 1/00 |
| 0102204 | 3/1984 | European Pat. Off. | H01L 31/02 |
| 3446243 | 6/1986 | Fed. Rep. of Germany | F28F 13/18 |

OTHER PUBLICATIONS

Japanese Abstract for No. 57-148138, Sep. 13, 1982.
U.S. patent application Ser. No. 07/271,930, filed Nov. 14, 1988 (Debe).
U.S. patent application Ser. No. 07/681,332, filed Apr. 5, 1991, entitled "Sensors Based on Nanostructured Composite Fibers" (Debe).
J. Vac. Sci. Technol. A, 5, (4), Jul./Aug., 1987, pp. 1914-1916, K. K. Kam, M. K. Debe, R. J. Poirier, and A. R. Drube.
J. Vac. Sci. Technol. A, 6, (3), May/Jun., 1988, pp. 1907-1911, M. K. Debe, K. K. Kam, J. C. Liu, and R. J. Poirier.
Thin Solid Films, 186, 1990, pp. 327-347, M. K. Debe and R. J. Poirier.
J. Mat. Sci., 25, 1990, pp. 5257-5268, Y. Sadaoka, T. A. Jones, G. S. Revell, W. Gopel.
Thin Solid Films, 47, 1977, pp. 219-233, A. G. Dirks and H. J. Leamy.
Rapidly Quenched Metals (Proc. of the Fifth Int. Conf. on Rapidly Quenched Metals, Wurzburg, Germany, Sep. 3-7, 1984), pp. 1117-1124, 1985, S. Ohnuma, Y. Nakanouchi & T. Masumoto.
J. Vac. Sci. Technol B, 8, (6), Nov./Dec., 1990, pp. 1199-1211, G. S. Oehrlein, J. F. Rembetski, and E. H. Payne.
J. Vac. Sci. Technol. A, 1, (3), Jul./Sep., 1983, pp. 1398-1402 J. A. Floro, S. M. Rossnagel, and R. S. Robinson.
Photo. Sci. and Eng., 24, (4), Jul./Aug., 1980, pp. 211-216, P. K. Lee and M. K. Debe.

Primary Examiner—Paul J. Thibodeau
Assistant Examiner—H. Thi Lê
Attorney, Agent, or Firm—Gary L. Griswold; Walter N. Kirn; Gregory D. Allen

[57] ABSTRACT

This invention provides a composite article having discrete microstructures partially encapsulated within a layer. A method of making the same is also provided. The article of the present invention is useful for visible radiation absorbing devices, such as, for example, selective solar absorbers, flat plate solar collectors, solar absorption panels, and solar cells.

37 Claims, 2 Drawing Sheets

COMPOSITE ARTICLE COMPRISING ORIENTED MICROSTRUCTURES

FIELD OF THE INVENTION

This invention relates to a composite article comprising uniformly or randomly oriented microstructures partially encapsulated within a layer. In another aspect, this invention relates to a method of making the same.

BACKGROUND OF THE INVENTION

Composite articles containing or exhibiting a microstructured layer or columnar-structured layer have been disclosed in the art.

For example, Kitamoto et al. U.S. Pat. No. 4,410,565 discloses an article said to be useful as a magnetic recording medium, the article comprising a substrate, a thermoplastic prime-coating layer provided thereon, a ferromagnetic metal layer having columnar grains which at least partially penetrate into the prime coat from the top thereof and are integrated therewith. A method of making the same is also disclosed. Further, U.S. Pat. No. Kitamoto et al. 4,588,656 teaches a method of preparing an article said to be useful as a magnetic recording medium, the method comprising vapor depositing a thin ferromagnetic metal film having spaced-apart columnar grain structures onto a substrate, impregnating the spaces between the columnar grain structures with at least one organic monomer or oligomer in the liquid form, and polymerizing the monomer or oligomer at least in the spaces between the columnar grain structures, whereby the resulting polymer is integrated with the thin ferromagnetic metal film.

Giacomel U.S. Pat No. 4,560,603 teaches a method for making a high strength laminated composite-structured material comprising the steps of (a) providing whiskers having a characteristically preferred orientation in an electromagnetic field, (b) placing fibers in a substantially overlapping relationship having viscous material therebetween to form a composite matrix, (c) disposing the whiskers in the viscous material, (d) applying a magnetic field about the whiskers in a shape effective to selectively orient the whiskers in a preferred direction, and (e) curing the composite matrix to form a laminate, while at the same time retaining the whiskers in the desired direction.

Adler U.S. Pat. No. 4,774,122 discloses a resinous product having a resinous surface which is coatable with a metal layer so as to be bonded through an array of microdendrites. A method of making the same is also disclosed.

U.S. Pat. No. 4,812,352 and assignee's U.S. patent application, Ser. No. 07/271,930, filed Nov. 14, 1988, now Debe U.S. Pat. No. 5,039,561 teach an article comprising a substrate bearing a microlayer (microstructured-layer) which comprises uniformly oriented, crystalline, solid, organic nanometer-sized microstructures and a method of making the same. Further, U.S. Pat. Nos. 4,812,352 and U.S. Ser. No. 07/271,930 teach optionally conformal coating the microlayer and encapsulating the conformal-coated microlayer.

Kam et al. in "Summary Abstract: Dramatic Variation of the Physical Microstructure of a Vapor Deposited Organic Thin Film" *J. Vac. Sci. Technol. A*, 5, (4), July/August, 1987, pp. 1914–16, teach a vacuum deposition method for making organic microstructures (or whiskers).

Debe et al, in "Vacuum Vapor Deposited Thin Films of a Perylene Dicarboxide Derivative: Microstructure Versus Deposition Parameters" *J. Vac. Sci. Technol. A,* 6, (3), May/June, 1988, pp. 1907–11, teach a vacuum vapor deposition method for generating organic microstructures.

Debe et al. in "Effect of Gravity on Copper Phthalocyanine Thin Films III: Microstructure Comparisons of Copper Phthalocyanine Thin Films Grown in Microgravity and Unit Gravity" *Thin Solid Films,* 186, 1990, pp. 327–47, disclose organic microstructured surfaces grown by physical vapor transport in microgravity and on the earth's surface.

Sadaoka et al. in "Effects of Morphology on $NO_2$ Detection in Air at Room Temperature with Phthalocyanine Thin Films", *J. Mat. Sci.,* 25, 1990, pp. 5257–68, teach a method of growing nickel phthalocyanine whiskers by annealing a film of the same in air.

Dirks et al. in "Columnar Microstructure in Vapor-Deposited Thin Films", *Thin Solid Films,* 47, 1977, pp. 219–33, review methods known in the art for making columnar microstructures.

Slocum U.S. Pat. No. 3,969,545 discloses a vacuum deposition technique for making organic or inorganic microstructures. The microstructured surface is said to have excellent polarization characteristics over wavelengths from the visible to the infrared region.

Ohnuma et al. in "Amorphous Ultrafine Metallic Particles Prepared By Sputtering Method", *Rapidly Quenched Metals,* (Proc. of the Fifth Int. Conf. on Rapidly Quenched Metals, Wurzburg, Germany, Sept. 3–7, 1984), S. Steeb et al., eds., Elsevier Science Publishers B.V., New York, (1985), pp. 1117–24, teach microstructured surfaces made using ion etching and rf sputter etching of polymer surfaces.

Bilkadi et al. U.S. Pat. No. 4,568,598 teaches a composite sheet-like article comprising surface ridges or needles of amplitude in the range of 0.1 to 5.0 micrometers and a separation of their axes in the range of 0.01 to 1.0 micrometer and having an aspect ratio in the range of 0.01 to 10 micrometers.

Maffitt et al. U.S. Pat. No. 4,340,276 discloses a method for making a microstructure on the surface of an article, the method comprising the steps of depositing a discontinuous coating of a material exhibiting a low rate of sputter etching and differentially sputter etching the composite surface to produce a topography of pyramid-like micropedestals random in height and separation.

Oehrlein et al. in "Study of Sidewall Passivation and Microscopic Silicon Roughness Phenomena in Chlorine-Based Reactive Ion Etching of Silicon Trenches", *J. Vac. Sci. Technol. B,* 8, (6), Nov./Dec., 1990, pp. 1199–1211, teach patterned structures using photolithographic and reactive ion etching methods.

Floro et al. in "Ion-Bombardment-Induced Whisker Formation On Graphite" *J. Vac. Sci. Technol, A,* 1, (3), July–Sept., 1983, pp. 1398–1402, disclose graphite whisker-like structures produced by an ion bombardment process.

Gilbert et al. U.S. Pat. No. 4,252,865, teaches a solar energy absorbing surface, the surface characterized by having an array of outwardly projecting structural elements of relatively high aspect ratio and having effective lateral spacings which are or include those in the order of magnitude of wavelengths within the solar-energy spectrum. The disclosed method for making the solar energy absorbing surface involves etching a sputtered amorphous semiconductor material (e.g., Ge).

Kuehn et al. U.S. Pat. No. 4,396,643 discloses a metal layer having a microstructured surface characterized by a plurality of randomly positioned discrete protuberances of varying heights and shapes. The microstructured surface is said to be useful as a radiation absorber.

Lee et al. in "Measurement and Modeling of the Reflectance-Reducing Properties of Gradient Index Microstructured Surfaces" *Photo. Sci. and Eng.*, 24, (4), July/August, 1980, pp. 211–16, describe microstructured surfaces having structure-element dimensions comparable to the wavelength of visible light.

Scherber et al. U.S. Pat. No. 4,148,294, discloses a panel said to be capable of absorbing incident solar energy at a high rate and of radiating only a small portion of the absorbed energy, the panel comprising (a) a continuous metallic substrate consisting predominately of aluminum, (b) an anodized layer covering a face of the substrate and being integrally bonded thereto, the layer consisting predominantly of aluminum oxide, the layer having a surface directed away from the substrate and formed with a multiplicity of pores spaced apart 0.1 to 1 micrometer and having a diameter of 0.1 to 0.5 micrometer, and (c) a multiplicity of elongated metallic bodies respectively received in the pores and longitudinally projecting outward of the surface.

Diepers U.S. Pat. No. 4,155,781 teaches a method for manufacturing solar cells comprising growing semiconductor whiskers on a substrate, the method comprising (a) providing a substrate which favors growth or germination of whiskers, (b) depositing a plurality of localized areas of an agent in which the semiconductor material is soluble, (c) growing whiskers of the semiconductor material by means of the Vapor Liquid Solid (VLS) method at the areas, (d) doping the whiskers with one of p or n doping material, (e) subsequently thereto doping the surface region of the whiskers up to a depth which approximately corresponds to the diffusion length of the charge carriers pairs with the other of a p or n doping material.

Lemkey et al. U.S. Pat. No. 4,209,008 discloses a photon absorbing surface having an oriented microstructure consisting of at least two phases, a continuous metallic matrix phase and a discontinuous second phase selected from the group consisting of metals, metalloids and intermetallics, with the second phase having dimensions on the order of 0.001 to 10 micrometers and with the second phase being oriented substantially normal to the surface; the surface portion of the matrix phase having been removed so that the second phase protrudes in relief.

SUMMARY OF THE INVENTION

Briefly, the present invention provides a composite article comprising a layer comprising a dense array of discrete microstructures partially encapsulated therein, wherein one distal end of at least a portion of the microstructures is exposed, and wherein the exposed distal ends of the microstructures and a surface of the layer are coincident on a common side of the layer. Preferably, the exposed distal ends of the microstructures and a surface of the layer are on a common plane. Optionally, the composite article of the present invention further comprises at least one conformal coating interposed between the microstructures and the encapsulant such that the conformal coating at least partially surrounds a plurality of microstructures.

The present invention also provides a composite article comprising a layer comprising a dense array of discrete, oriented microstructures (fully) encapsulated therein, such that at least one distal end of each of the microstructures lies just below a surface of the layer (i.e., the microstructures are not exposed).

The dense array of discrete microstructures can be uniformly or randomly oriented. The spatial distribution may be a random or regular array.

The distribution of microstructures need not be uniform (i.e., the distribution of microstructures may be continuous or discontinuous). For example, the distribution of microstructures may form a pattern. The pattern may be repeating or non-repeating.

Preferably, the microstructures have monocrystalline or polycrystalline regions.

Suitable microstructure materials include those which are stable in air and which can be formed into the microstructures. Preferably, the microstructures comprise at least one of an inorganic material and an organic material.

Useful inorganic materials include, for example, ceramics (e.g., metal or non-metal oxides such as alumina, silica, iron oxide, and copper oxide; metal or non-metal nitrides such as silicon nitride and titanium nitride; and metal or non-metal carbides such as silicon carbide; metal or non-metal borides such as titanium boride); metal or non-metal sulfides such as cadmium sulfide and zinc sulfide; metal silicides such as magnesium silicide, calcium silicide, and iron silicide; metals (e.g., noble metals such as gold, silver, platinum, rhenium, osmium, iridium, palladium, ruthenium, rhodium, and combinations thereof; transition metals such as scandium, vanadium, chromium, manganese, cobalt, nickel, copper, zirconium, and combinations thereof; low melting metals such as bismuth, lead, indium, antimony, tin, zinc, and aluminum; refractory metals such as tungsten, rhenium, iridium, tantalum, molybdenum, rhodium, and combinations thereof); and semiconductor materials (e.g., diamond, germanium, selenium, arsenic, silicon, tellurium, gallium arsenide, gallium antimonide, gallium phosphide, aluminum antimonide, indium antimonide, indium tin oxide, zinc antimonide, indium phosphide, aluminum gallium arsenide, zinc teluride, and combinations thereof).

Useful organic materials include, for example, polymers and prepolymers thereof (e.g., thermoplastic polymers such as, for example, alkyds, aminos (e.g., melamine and urea formaldehyde), diallyl phthalates, epoxies, phenolics, polyesters, and silicones; thermoset polymers, such as, for example, acrylonitrile-butadienestyrene, acetals, acrylics, cellulosics, chlorinated polyethers, ethylene-vinyl acetates, fluorocarbons, ionomers, nylons, perylenes, phenoxies, polyallomers, polyethylenes, polypropylenes, polyamide-imides, polyimides, polycarbonates, polyesters, polyphenylene oxides, polystyrenes, polysulfones, and vinyls; and organometallics (e g, bis($\eta^5$-cyclopentadienyl iron (II), iron pentacarbonyl, ruthenium pentacarbonyl, osmium pentacarbonyl, chromium hexacarbonyl, molybdenum hexacarbonyl, tungsten hexacarbonyl, and tris(triphenylphosphine) rhodium chloride).

Preferably, the microstructures comprise an organic material. Preferably, the molecules of the organic material are planar and comprise chains or rings, preferably rings, over which $\pi$-electron density (pi-electron density) is extensively delocalized. The most preferred organic materials can broadly be classified as polynuclear aromatic hydrocarbons and heterocyclic aromatic compounds.

A preferred method for making the composite article of the present invention comprises the step of providing a composite article comprising a substrate bearing an encapsulated, microstructured-layer, wherein the microstructured-layer comprises a dense array of discrete, uniformly or randomly oriented microstructures; and delaminating the encapsulated microstructured-layer from the substrate to provide the composite article of the present invention. In a more preferred method, the composite article comprising the substrate bearing the encapsulated microstructured layer further comprises at least one conformal coating interposed between one or more of the microstructures and the encapsulant such that the conformal coating at least partially surrounds each of a plurality of microstructures and delaminating the encapsulated microstructured-layer from the substrate to provide the composite article according to the present invention.

More than one conformal coating may be present on each microstructure. Multiple conformal coatings may have the same or different compositions.

On each microstructure, a single conformal coating may be continuous or discontinuous. Preferably, a single conformal coating is continuous. If multiple conformal coatings are applied, each individual conformal coating may be continuous or discontinuous. Preferably, multiple conformal coatings collectively are continuous.

The conformal coating covering an array of microstructures may be patterned, wherein the pattern may be repeating or non-repeating.

The encapsulating material may form a continuous or discontinuous coating over the microstructured-layer or conformal-coated, microstructured-layer. Preferably, the encapsulating material forms a continuous layer. Additional encapsulating materials having the same or different compositions may form a continuous or discontinuous coating over the exposed surface of the microstructured-layer or conformal-coated, microstructured-layer having a discontinuous coating of encapsulating material. Multiple encapsulating materials may form a continuous or discontinuous coating over the collective surface of the underlying encapsulating material and the exposed microstructured-layer or conformal-coated, microstructured-layer. A discontinuous coating of an encapsulant may be patterned, wherein the pattern may be repeating or non-repeating.

A composite article according to the present invention having the microstructured-layer or conformal-coated, microstructured-layer partially encapsulated therein may further comprise an overcoat layer such as, for example, a thermal conducting material coated onto the major surface opposite the exposed surface of the composite article, (i.e., the back surface) for the purpose of aiding heat transfer; an adhesive material coated onto the back surface of the composite article for the purpose of bonding the article to a substrate; an antireflective material coated on the front surface of the composite article to reduce or match the reflectance of the encapsulant or the microstructure; a passivation material coated onto at least one of the back surface and front surface of the composite article; and a polymeric or inorganic material, coated on the front surface of the composite article to serve, for example, as a protective layer.

In this application:

"microstructure" or "microstructured element" refers to individual repeating units such as, for example, whiskers, rods, cones, pyramids, cylinders, laths, and the like;

"dense array" means microstructures in a closely spaced regular or random arrangement, wherein the mean spacing is typically in the range from about 1 nanometer to about 5000 nanometers, and preferably in the range from about 10 to about 1000 nanometers, and wherein preferably the mean spacing is approximately equal to the mean diameter of the microstructures;

"microstructured-layer" refers to a layer formed by all the microstructures taken together;

"composite microstructures" refers to conformal-coated microstructures;

"conformal-coated" means a material is deposited onto at least a portion of at least one microstructure element and conforms to the shape of at least a portion of the microstructure element;

"uniformly oriented" means the angles between an imaginary line perpendicular to the surface of the substrate and the major axes of at least 90% of the microstructures varies no more than approximately ±15° from the mean value of the aforementioned angles;

"randomly oriented" means the angles between an imaginary line perpendicular to the surface of the microstructure inventive composite article and the major axes of at least 90% of the microstructures varies more than approximately ±15° from the mean value of the aforementioned angles;

"solidified" means the encapsulant undergoes a change in state, typically from a liquid or liquid-like phase to a more rigid, solid, or solid-like phase, such as may occur as a result of drying, chemical setting, cooling, freezing, gelling, polymerization, etc.

"continuous" means coverage of a surface without interruption;

"discontinuous" means coverage of a surface wherein there is periodic or intermittent interruption (i.e., non-periodic) (such interruption in coverage for example, may involve individual microstructures, which have coated and uncoated regions, or more than one microstructure, wherein one or more microstructures are coated and one or more adjacent microstructures are uncoated);

"uniform" with respect to size, means that the major dimension of the cross-section of the individual microstructures varies no more than about 25% from the mean value of the major dimension and the minor dimension of the cross-section of the individual microstructures varies no more than about 25% from the mean value of the minor dimension; and "areal density" means the number of microstructures per unit area.

Composite articles according to the present invention are useful for radiation absorbing devices, including, for example, visible radiation absorbing devices. Particularly, useful radiation absorbing devices include, for example, selective solar absorbers, flat plate solar collectors, solar absorption panels, and solar cells.

Figure 2B:
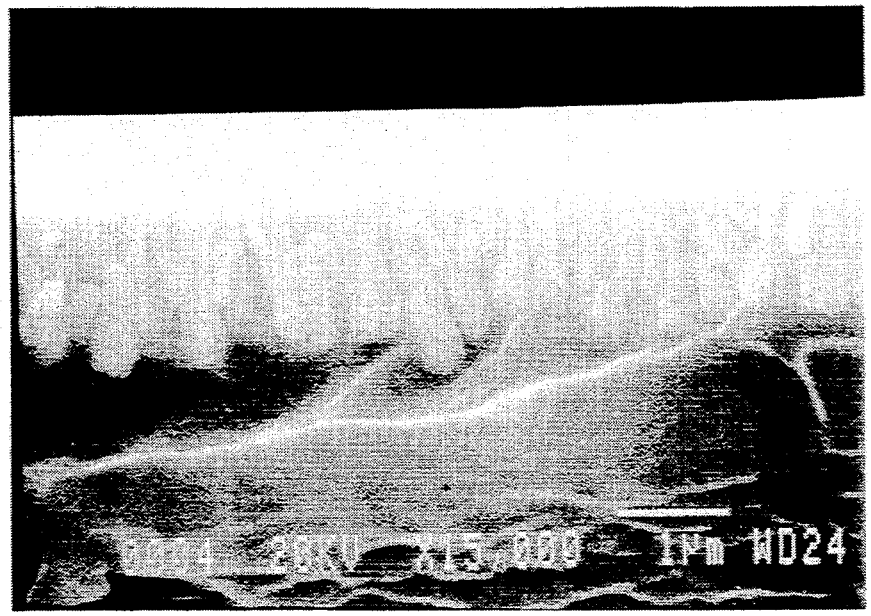
Figure 2A:
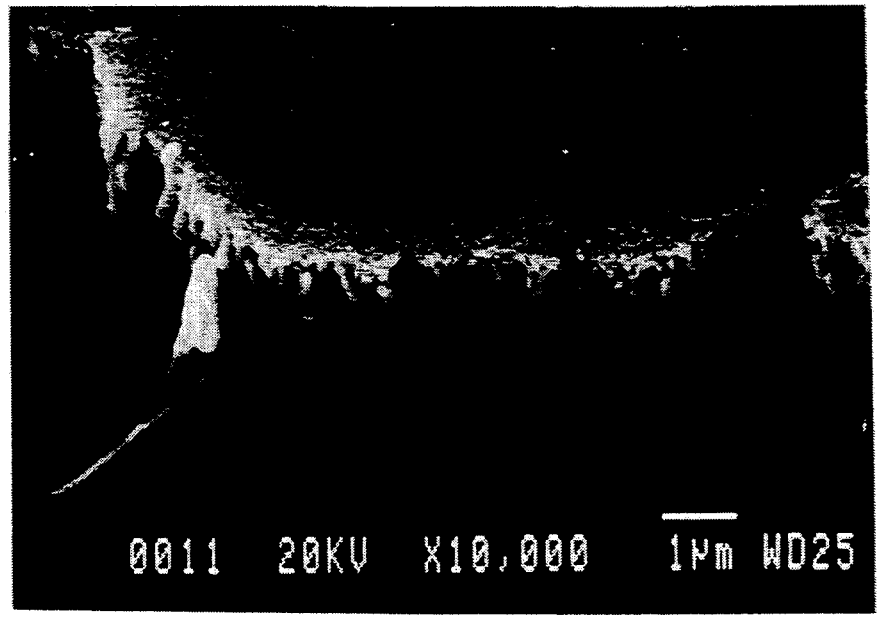

The scanning electron micrographs (SEM's) shown in FIGS. 2(a) and 2(b), which were taken at 10,000X and 15,000X, respectively, show a fractured surface of an edge of a composite layer which was formed by partially encapsulating Fe-coated whiskers with an adhesive, i.e., a solution of a thermoplastic resin in toluene or other solvents, (commercially available under the trade designation "DUCO CEMENT" from Devcon Corp. of Wood Dale, Ill.), curing the adhesive and then delaminating the composite layer from the original substrate surface. The micrographs were taken at a viewing angle of incidence with respect to the plane of the surface of about 45° from the delaminated surface of the cured adhesive in (a) and near 0° in (b).

DETAILED DESCRIPTION OF PREFERRED EMBODIMENTS

Orientation of the microstructures is generally uniform in relation to the surface of the substrate. The microstructures are usually oriented normal to the original substrate surface, the surface normal direction being defined as that direction of the line perpendicular to an imaginary plane lying tangent to the local substrate surface at the point of contact of the base of the microstructure with the substrate surface. The surface normal direction is seen to follow the contours of the surface of the substrate. Preferably, the major axes of the microstructures are parallel to each other.

Preferably, the microstructures are of uniform size and shape, and have uniform cross-sectional dimensions along their major axes. The preferred length of each microstructure is less than about 50 micrometers. More preferably, the length of each microstructure is in the range from about 0.1 to 5 micrometers. Preferably, the width of each microstructure is less than about 1 micrometer. More preferably, the width of each microstructure is in the range from 0.01 to 0.5 micrometer.

Preferably, the microstructures have an areal number density in the range from about 0.04 to about $10^6$ microstructures per square micrometer. More preferably, the microstructures have an areal density in the range from about 1 to about $10^4$ microstructures per square micrometer.

Although microstructures can have a variety of shapes, (e.g., whiskers, rods, cones, pyramids, cylinders, laths, and the like), it is preferable that the shapes of the individual microstructures in any given microstructured-layer be the same.

The microstructures preferably have a high aspect ratio, (i.e., a length to diameter ratio in the range from about 3:1 to about 100:1).

Preferred Method for Making a Microstructured-Layer

A preferred method for making an organic-based microstructured-layer is disclosed in U.S. Pat. No. 4,812,352 and assignee's patent application, U.S. Ser. No. 07/271,930, filed Nov. 14, 1988, now Debe U.S. Pat. No. 5,039,561 the disclosures of which are incorporated herein by reference. As disclosed therein, a method for making a microstructured-layer comprises the steps of i) depositing a vapor of an organic material as a thin, continuous or discontinuous layer onto a substrate to provide a composite structure; and ii) annealing the deposited organic layer in a vacuum for a time and at a temperature sufficient to induce a physical change in the deposited organic layer to form a microstructured-layer comprising a dense array of discrete microstructures;

Materials useful as a substrate include those which maintain their integrity at the temperatures and vacuums imposed upon them during the vapor deposition and annealing steps. The substrate can be flexible or rigid, planar or non-planar, convex, concave, aspheric, or combinations thereof.

Preferred substrate materials include organic materials and inorganic materials (including, for example, ceramic materials, metallic materials, and semiconductor materials). The preferred substrate material is metallic.

Preferred organic substrates include, for example, polyimide film (commercially available, for example, under the trade designation "KAPTON" from Du Pont Electronics of Wilmington, Del.).

Metals useful as substrates include, for example, aluminum, cobalt, copper, molybdenum, nickel, platinum, tantalum, or combination thereof. Ceramics useful as a substrate material include, for example, metal or nonmetal oxides such as alumina and silica.

Preferred methods for preparing a metal substrate include, for example, vacuum vapor depositing or ion sputter depositing a metal layer onto a polyimide sheet or web. Preferably, the thickness of the metal layer is about one hundred nanometers. Although not necessarily detrimental, exposure of the metal surface to an oxidizing atmosphere (e.g., air) may cause an oxide layer to form thereon.

The organic material from which the microstructures are formed may be coated onto the substrate using techniques known in the art for applying a layer of an organic material onto a substrate, including, for example, vapor phase deposition (e.g., vacuum evaporation, sputter coating, and chemical vapor deposition), and solution coating or dispersion coating (e.g., dip coating, spray coating, spin coating, blade or knife coating, bar coating, roll coating, and pour coating (i.e., pouring a liquid over a surface and allowing the liquid to flow over the surface). Preferably, the organic layer is applied by physical vacuum vapor deposition (i.e., sublimation of the organic material under an applied vacuum).

Preferably, the chemical composition of the organic-based microstructured-layer will be the same as that of the starting organic material. Organic materials useful in preparing the microstructured- layer include, for example, planar molecules comprising chains or rings over which $\pi$-electron density is extensively delocalized. These organic materials generally crystallize in a herringbone configuration. Preferred organic materials can be broadly classified as polynuclear aromatic hydrocarbons and heterocyclic aromatic compounds.

Polynuclear aromatic hydrocarbons are described in Morrison and Boyd, *Organic Chemistry*, Third Edition, Allyn and Bacon, Inc. (Boston: 1974), Chapter 30. Heterocyclic aromatic compounds are described in Morrison and Boyd, supra, Chapter 31.

Preferred polynuclear aromatic hydrocarbons, which are commercially available, include, for example, naphthalenes, phenanthrenes, perylenes, phenyls, anthracenes, coronenes, and pyrenes. A preferred polynuclear aromatic hydrocarbon is N,N'-di(3,5-xylyl)perylene-3,4,9,10 bis(dicarboximide) (commercially available under the trade designation "C. I. PIGMENT RED 149" from American Hoechst Corp of Somerset, N.J.), herein designated "perylene red."

Preferred heterocyclic aromatic compounds, which are commercially available, include, for example, phthalocyanines, porphyrins, carbazoles, purines, and pterins. Representative examples of heterocyclic aromatic compounds include, for example, metal-free phthalocyanine (e.g., dihydrogen phthalocyanine) and its metal complexes (e.g. copper phthalocyanine).

The organic materials preferably are capable of forming a continuous layer when deposited onto a substrate. Preferably, the thickness of this continuous layer is in the range from 1 nanometer to about one thousand nanometers.

Orientation of the microstructures is affected by the organic material deposited, the substrate temperature during deposition, and the deposition rate and angle of incidence. If the temperature of the substrate during deposition of the organic material is sufficiently high, the deposited organic material will form randomly oriented microstructures either as deposited or when subsequently annealed. If the temperature of the substrate during deposition is relatively low (i.e., near room temperature), the deposited organic material tends to form uniformly oriented microstructures when annealed. For example, if uniformly oriented microstructures comprising perylene red are desired, the temperature of the substrate during the deposition of the perylene red is preferably about 0° to about 30° C.

The major dimension of each microstructure is directly proportional to the thickness of the initially deposited organic layer. Since the microstructures are discrete, are separated by distances on the order of their width, and preferably have uniform cross-sectional dimensions, and since it appears that all the original organic film material is converted to microstructures, conservation of mass implies that the lengths of the microstructures will be proportional to the thickness of the layer initially deposited. Due to the apparent relationship of the original organic layer thickness to the lengths of the microstructures, the lengths and aspect ratios of the microstructures can be varied independent of their cross-sectional dimensions and areal densities. For example, it has been found that the length of microstructures are approximately ten times the thickness of a vapor deposited organic layer, when the thickness ranges from about 0.05 to about 0.2 micrometer. The minor dimension of the microstructures is determined by the surface free energy ratios of the bounding crystallographic side planes and can be explained by Wulff's theorem. The surface area of the microstructured-layer (i.e., the sum of the surface areas of the individual microstructures) is much greater than that of the organic layer initially deposited on the substrate. Preferably, thickness of the initially deposited layer is in the range from about 0.05 to about 0.25 micrometer.

Each individual microstructure is monocrystalline or polycrystalline, rather than amorphous. The microstructured-layer has highly anisotropic properties due to the crystalline nature and uniform orientation of the microstructures.

If a discontinuous distribution of microstructures is desired, masks may be used in the organic layer deposition step to selectively coat specific areas or regions of the substrate. A discontinuous distribution of microstructures may also be obtained by coating (e.g., sputter coating, vapor coating, or chemical vapor depositing) a layer of metal (e.g., Au, Ag, and Pt) onto the organic layer prior to the annealing step. Areas of the organic layer having the metal coating thereon generally do not convert to the microstructures during the annealing step. Preferably, the thickness of the metal coating is in the range from about 0.1 to about 10 nanometers.

Other techniques known in the art for selectively depositing an organic layer on specific areas or regions of a substrate may also be useful.

In the annealing step, the substrate having the organic layer coated thereon is heated in a vacuum for a time and at a temperature sufficient for the coated organic layer to undergo a physical change, wherein the organic layer grows to form a microstructured-layer comprising a dense array of discrete, oriented monocrystalline or polycrystalline microstructures. Orientation of the microstructures is an inherent feature of the annealing process. Exposure of the coated substrate to the atmosphere prior to the annealing step is not observed to be detrimental to subsequent microstructure formation.

If, for example, the coated organic material is perylene red or copper phthalocyanine, annealing is preferably done in a vacuum (i.e., less than about $1 \times 10^{-3}$ Torr) at a temperature in the range from about 160° to about 300° C. The annealing time necessary to convert the original organic layer to the microstructured-layer is dependent on the annealing temperature. Typically, an annealing time in the range from about 10 minutes to about 6 hours is sufficient. Preferably the annealing time is in the range from about 20 minutes to about 4 hours.

The time interval between the vapor deposition step and the annealing step can vary from several minutes to several months, with no significant adverse effect, provided the coated composite is stored in a covered container to minimize contamination (e.g., dust). As the microstructures grow, the infrared band intensities change and the laser specular reflectivity drops, allowing the conversion to be carefully monitored, for example, in situ by infrared spectroscopy. After the microstructures have grown to the desired dimensions, the resulting layered structure, which comprises the substrate and the microstructures, is allowed to cool before being brought to atmospheric pressure.

If a non-uniform distribution of microstructures is desired, microstructures may be selectively removed from the substrate, for example, by mechanical means, vacuum process means, chemical means, gas pressure or fluid means, and combinations thereof. Useful mechanical means include, for example, scraping microstructures off the substrate with a sharp instrument (e.g., with a razor blade). Useful chemical means include, for example, acid etching selected areas or regions of the microstructured-layer. Useful vacuum means include, for example, ion sputtering and reactive ion etching. Useful air pressure means include, for example, blowing the microstructures off the substrate with a gas (e.g., air) or fluid stream.

Other Methods for Making a Microstructured-Layer

Other methods for making microstructured-layers are known in the art. For example, methods for making organic microstructured-layers are disclosed in *J. Vac. Sci. Technol. A*, 5, (4), July/August, 1987, pp. 1914–16; *J. Vac. Sci. Technol. A*, 6, (3), May/August, 1988, pp. 1907–11; *Thin Solid Films*, 186, 1990, pp. 327–47; *J. Mat. Sci.*, 25, 1990, pp. 5257–68; Slocum U.S. Pat. No. 3,969,545; *Rapidly Quenched Metals*, Proc. of the Fifth Int. Conf. on Rapidly Quenched Metals, Wurzburg, Germany, Sep. 3–7, 1984), S. Steeb et al , eds , Elsevier Science Publishers B.V., New York, (1985), pp. 1117–24; and Bilkadi et al. U.S. Pat. No. 4,568,598; *Photo. Sci. and Eng.*, 24, (4), July/August, 1980, pp. 211–16; and Maffitt et al. U.S. Pat. No. 4,340,276, the disclosures of which are incorporated herein by reference. Methods for making inorganic-based microstructured-layers of whiskers are disclosed, for example, in Slocum U.S. Pat. No. 3,969,545; *J. Vac. Sci. Tech. A*, 1, (3), July/Sept., 1983, pp. 1398–1402; Gilbert et al. U.S. Pat. No. 4,252,865; Kuehn et al. U.S. Pat. No. 4,396,643; Scherber et al. U.S. Pat. No. 4,148,294; Diepers U.S. Pat. No. 4,155,781; and Lemkey et al. U.S. Pat. No. 4,209,008, the disclosures of which are incorporated herein by reference.

It is within the scope of the present invention to modify the methods for making a microstructured-layer to make a discontinuous distribution of microstructures. Examples of means for modifying these methods are disclosed above in the description of the preferred method for making the microstructured-layer.

Preferably, the conformal coating material, if applied, serves as a functional layer imparting desirable properties such as thermal properties, optical properties, mechanical properties (e.g., strengthens the microstructures comprising the microstructured layer), electronic properties, and chemical properties (e.g., provides a protective layer).

The conformal coating material can be an organic material including a polymeric material or an inorganic material. Useful organic and inorganic conformal coating materials include, for example, those described above in the description of the microstructures. Useful organic materials also include, for example, conductive polymers (e.g., polyacetylene), polymers derived from poly-p-xylylene, and surfactants.

The preferred thickness of the conformal coating is typically in the range from about 0.2 to about 50 nm, depending on the particular application.

The conformal coating may be deposited onto the microstructured-layer using conventional techniques, including, for example, those disclosed in Debe U.S. Pat. No. 4,812,352, and assignee's U.S. patent application Ser. No. 07/271,930, filed Nov. 14, 1988, now Debe U.S. Pat. No. 5,039,561 the disclosures of which are incorporated herein by reference. Preferably, the conformal coating is deposited by a method which avoids disturbance of the microstructured-layer by mechanical forces, including, for example, vapor phase deposition (e.g., vacuum evaporation, sputter coating, and chemical vapor deposition) and solution coating or dispersion coating (e.g., dip coating, spray coating, spin coating, pour coating (i.e., pouring a liquid over a surface and allowing the liquid to flow over the microstructured-layer) and immersion coating (i.e., immersing the microstructured-layer in a solution for a time sufficient to allow the layer to adsorb molecules from the solution, or colloidals or other particles from the dispersion). More preferably, the conformal coating is deposited by vapor phase deposition methods, such as, for example, ion sputter deposition, vapor condensation, vacuum sublimation, physical vapor transport, chemical vapor transport, and metalorganic chemical vapor deposition.

For the deposition of a discontinuous conformal coating, the deposition techniques are modified as is known in the art to produce such discontinuous coatings. Known modifications include, for example, use of masks, shutters, directed ion beams, and deposition source beams.

The encapsulating material which is coated over the microstructured-layer, or conformal-coated, microstructured-layer is such that it can be applied to the exposed surface of the microstructured-layer or conformal-coated, microstructured-layer in a liquid or fluid state, and then be solidified or immobilized. Alternatively, the encapsulating material is such that it is in a vapor state which can be applied to the exposed surface of the microstructured-layer or conformal-coated microstructured-layer.

The encapsulating material can be an organic material including a polymeric material or an inorganic material. Useful organic and inorganic encapsulating materials include, for example, those described above in the description of the microstructures and the description of the conformal coating. Particularly useful polymers include, for example, thermoplastics, thermosets, and photopolymers.

The preferred total thickness of the coated encapsulating material is typically in the range from about 2 to about 100 micrometers, depending on the particular application.

The encapsulating material may be applied to the microstructured-layer or conformal-coated, microstructured-layer by means appropriate for the particular encapsulating material. For example, an encapsulating material in a liquid or fluid state may be applied to the exposed surface of the microstructured-layer or conformal-coated, microstructured-layer by solution coating or dispersion coating (e.g., spin coating, dip coating, immersion coating, spray coating, roll coating, pour coating, knife or blade coating, and bar coating). An encapsulating material may be applied in a vapor state by using conventional vapor deposition techniques including, for example, condensation of the vapor onto the microstructured-layer or conformal-coated microstructured-layer.

An encapsulating material may also be deposited by solid-liquid deposition, wherein a solid, preferably a powder, is applied to the exposed surface of the microstructured-layer or conformal-coated, microstructured-layer, liquified by applying a sufficient amount of energy (e.g., by heating, by radiation, or by conduction) to transform the solid material to a liquid or fluid material (without adversely affecting the microstructured-layer or conformal-coated, microstructured-layer), and then solidifying or immobilizing the liquid or fluid material.

The applied encapsulating material may be solidified or immobilized by means appropriate to the particular material used. Such solidification or immobilization means include, for example, curing or polymerizing techniques known in the art (e.g., radiation, free radical, anionic, cationic, condensation, step growth process, or combinations thereof). Other solidification or immobilization means include, for example, freezing.

Application of a discontinuous coating of an encapsulating material may be accomplished by modifying techniques used to apply the encapsulating material. Useful modifications include, for example, the use of masks, directed spray, and photolithography techniques.

The resulting composite layer which comprises the microstructured-layer or conformal-coated, microstructured-layer and the encapsulated material may be delaminated from the substrate at the original substrate interface by mechanical means such as, for example, pulling the composite layer from the substrate, pulling the substrate from the composite layer, or a combination thereof. In some instances, the composite layer may self-delaminate during solidification of the encapsulating material. Similarly, the composite layer may be delaminated from the substrate by heating or cooling such that the forces resulting from the differences in thermal expansion coefficients between the substrate and the composite layer cause the composite layer and substrate to delaminate from each other.

Delamination of the composite layer from the substrate exposes one cross-sectional end of each microstructure, wherein a surface of the encapsulating material and the exposed cross-sectional ends of the microstructures are coincident on a common side. Topography of the delaminated surface of the composite layer (i.e., the surface from the delaminated interface) will be the inverse of the topography of the substrate surface from which it is delaminated. If the surface of the substrate is perfectly smooth, the exposed cross-sectional ends of the microstructures and the delaminated surface of the encapsulating material may be on a common plane.

Optionally, the delaminated surface of the composite article of the present invention may be overcoated with at least one coating material. Each overcoating may be continuous or discontinuous. Such overcoatings are useful in improving the handling or durability characteristics of the composite article, or be necessary for particular applications.

Figure 1:
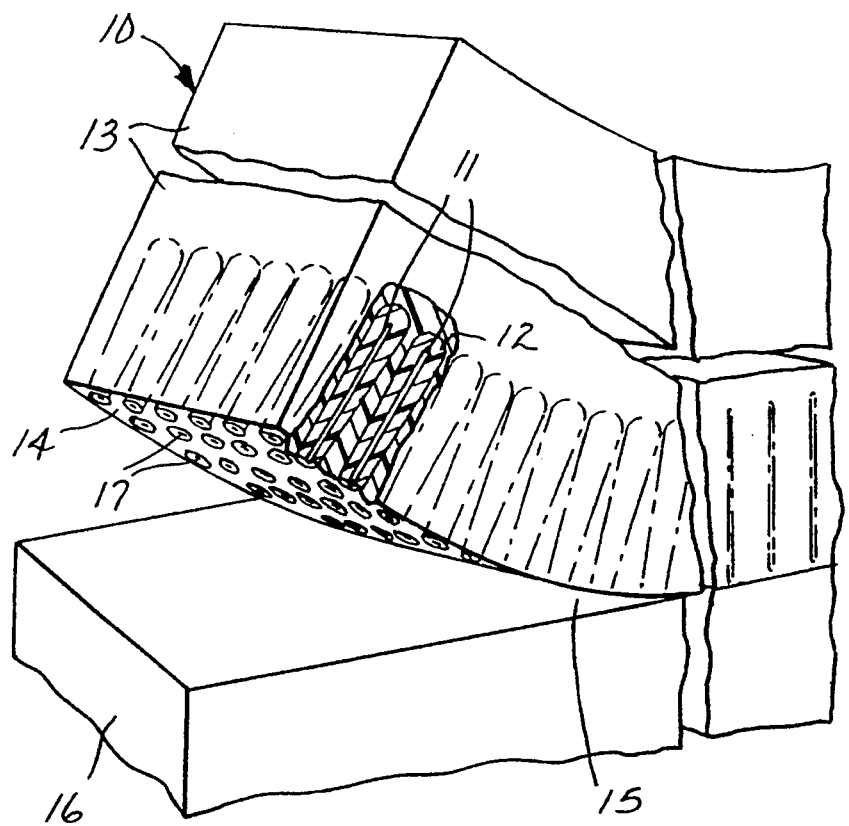
FIG. 1 illustrates a composite article according to the present invention, shown partially delaminated from the original substrate.

Referring to FIG. 1, composite article 10 comprises a plurality of microstructures 11, optional conformal coating material 12, and encapsulating material 13 partially broken away to show detail. Further, FIG. 1 illustrates delamination of composite article surface 14 from substrate surface 15 of substrate 16, exposing distal ends of microstructure 17.

The thickness of the overcoating (i.e., encapsulant) is typically in the range from about 1 micrometer to about 1 mm, depending on the particular application.

Methods for depositing an overcoating material on the delaminated surface of the composite article of the present invention include techniques known in the art for depositing the coating material on a substrate. Such methods include, for example, the methods described above for depositing the conformal coating on the microstructured surface and the methods described above for depositing the encapsulating material onto the microstructured-layer or conformal-coated, microstructured-layer.

It is in the scope of the present invention to have a composite article having multiple microstructured-layers. For example, two or more composite articles may be laminated together.

The composite article of the present invention is useful for visible radiation absorbing devices, such as, for example, selective solar absorbers, flat plate solar collectors, solar absorption panels (such as the type of devices described in U.S. Pat. No. 4,148,294) and solar cells (such as the type of device described in U.S. Pat. No. 4,155,781).

Objects and advantages of this invention are further illustrated by the following examples, but the particular materials and amounts thereof recited in these examples, as well as other conditions and details, should not be construed to unduly limit this invention. All parts and percentages are by weight unless otherwise indicated.

EXAMPLE 1

A sample was prepared by spraying a latex rubber onto a microstructured-layer of discrete, perpendicularly oriented crystalline whiskers, comprising N,N'-di(3,5-xylyl)perylene-3,4,9,10 bis(dicarboximide) (i.e., perylene red), prepared using the techniques described in U.S. Pat. No. 4,812,352. Specifically, a layer of copper having a thickness of about 100 nanometers was deposited onto a glass microscope slide by sputtering. N,N'-di(3,5-xylyl)perylene-3,4,9,10 bis(dicarboximide), an organic pigment commercially available under the trade designation "C.I. PIGMENT RED 149" from American Hoechst Corp. of Somerset, N.J., was vacuum vapor deposited ("base" pressure of about $2 \times 10^{-6}$ Torr), onto the copper-coated microscope slide, to a thickness of about 146 nm at an average deposition rate of 20 nm/minute.

The resulting composite was then annealed to a maximum temperature of 200° C. in a vacuum to convert the organic layer to a microstructured-layer of discrete, perpendicularly-oriented crystalline whiskers.

Approximately one-third of the microstructured-layer was sputter coated with copper to provide a conformal copper coating having an equivalent planar thickness of about 100 nanometers. The effective thickness of the copper coating on the sides of the whiskers was significantly less than 100 nanometers due to the much larger surface area of the whiskers relative to a flat surface.

About one-half of the microstructured-layer was sputter-coated with platinum to provide a conformal platinum coating having an equivalent planar thickness of about 100 nanometers.

The remaining one-sixth of the microstructured layer was left uncoated.

A conventional air pressurized spray painter was used to spray a layer of an encapsulating precursor (commercially available under the trade designation "STRIPPABLE MASKANT YR-43" from the 3M Company of St. Paul, Minn.) over the entire microstructured-layer to provide a wet thickness of about 0.157 to about 0.165 mm. The encapsulating layer was dried in a conventional oven at about 66° C. (150° F.) for about 20 minutes.

The resulting composite article on the copper-coated glass slide (i.e., the conformal-coated microstructured-layer with the encapsulating material coated thereon) was cut into strips about 0.6 cm (0.25 inch) wide with a razor blade. The composite layer of each strip comprising the conformal-coated and uncoated (i.e., the portion of the microstructured layer not having the copper or platinum conformal coating) microstructured-layer and the encapsulating material was delaminated from the surface of the copper-coated glass slide. The relative adhesion of the areas of the composite having the copper conformal coating, the platinum conformal coating, and no conformal coating (i.e., bare whiskers), to the copper-coated glass slide were observed to be different. Adhesion of the strips having platinum as the conformal coating to the copper-coated glass surface was the greatest, followed by the adhesion of the strips with conformal copper coating to the copper-coated surface. The weakest adhesion observed was that of the strip having bare whiskers to the copper-coated surface.

Delamination of the composite layers having the conformal platinum coating, the conformal copper coating, and the bare whiskers from the copper-coated glass surface was observed to be 100%.

A SEM of the alelaminated surface of the composite layer, taken at about 2000X revealed that the whiskers protruded slightly from the latex encapsulant.

EXAMPLE 2

Conventional aluminum foil having a thickness of about 0.025 mm (0.001 inch) was stretch-mounted between two stainless rings each having a diameter of about ten centimeters. One surface of both the aluminum foil and the rings were cleaned by vapor degreasing and oxygen plasma etching.

A microstructured-layer of whiskers comprising perylene red was deposited onto the "cleaned" aluminum surface and the stainless steel rings using the method described in Example 1 for forming the microstructured-layer onto the copper-coated glass surface.

The microstructured-layer on the foil and rings was sputter-coated with CoCr to provide a conformal CoCr coating having an equivalent planar thickness of about 125 nanometers. The sputter coating was done using a conventional rf (13.7 MHz) glow discharge unit, wherein the distance between the twenty centimeter (8 inch)-diameter targets and the substrate was about ten centimeters. The sputtering pressure was about 24 mTorr of Ar, forward power was about 500 watts, and target bias was about 1200 volts. The substrate support was water cooled during the sputtering of the CoCr.

Several droplets of an adhesive, i.e., a solution of a thermoplastic resin in toluene or other solvents, (commercially available under the trade designation "DUCO CEMENT" from Devcon Corp. of Wood Dale, Ill.) were placed on the perimeter of one of the stainless steel rings, giving about a 90 degree contact angle at the adhesive-conformal-coated microstructured-layer interface. The droplets were covered with several small pieces (about 1cm×1cm) of 152 micrometer (6 mil) thick polyester film to slightly spread each droplet of cement over an area about 6 to 9 mm in diameter The adhesive was partially dried in air for about 10 minutes and then heated at about 50° C. for about 2 hours. The patches of dried adhesive having conformal-coated whiskers bonded thereto, were easily delaminated from the stainless steel ring by sliding the edge of a razor blade under each patch to form self-supporting petals having a thickness of about 0.1 to about 0.125 mm.

A SEM of a freeze fractured edge of one of the delaminated composites having the CoCr conformal coating, taken at about 10,000X, revealed that the whiskers appeared to be oriented with one end located at the place of the original interface with the stainless steel substrate. Further, it appeared that the relief of the delaminated surface was a "negative" of the surface texture of the stainless steel ring.

The delaminated composite layer (article) had sufficient integrity to be handled, rubbed, bent, and stretched with no apparent degradation in its physical characteristics.

The composite layer was observed to be attracted to a small hand held magnet.

EXAMPLE 3

A piece of conventional aluminum foil (about 25 micrometers thick) was stretch-mounted on an 8.9 cm diameter stainless steel ring. A surface of the aluminum foil was cleaned as described in Example 2. A microstructured-layer of perylene red was deposited onto the "clean" aluminum surface by the method described in Example 1.

The microstructured-layer was sputter-coated with Fe to provide a conformal Fe coating having a planar thickness of 280 nm. The conformal-coated microstructured-layer was then overcoated with a layer of adhesive (DUCO CEMENT) by applying several drops of the adhesive to the center of the coated aluminum foil and then spinning the coated aluminum foil for about 5 to 10 seconds at about 500 rpm. The amount of adhesive used was sufficient to provide a cured thickness of about 0.064 mm. The resulting composite layer, which comprised the conformal-coated microstructured-layer and the adhesive, was easily delaminated from the aluminum foil surface. However, delamination required more force than in Examples 1 and 2. Delamination appeared to be 100%.

FIG. 2 (*a*) shows a SEM of the delaminated surface of the composite layer at a viewing angle of about 45 degrees to the surface normal at 10,000X FIG. 2 (*b*) shows a SEM of an edge view of the delaminated surface of the composite layer at 15,000X.

EXAMPLE 4

A microstructured-layer of perylene red was deposited onto aluminum foil as described in Example 3. The microstructured-layer was sputter-coated with copper to provide a conformal coating of copper having a planar equivalent thickness of about 100 nm.

A polyester resin (commercially available under the trade designation "VITEL 200A" from Goodyear Tire and Rubber Co. of Atlanta, Ga.) was blended with a solvent containing equal portions of methyl ethyl ketone and toluene to provide an encapsulating resin having about 45 percent solids. The encapsulating resin was overcoated onto the conformal-coated microstructured-layer by applying drops of the resin to the layer, which flowed to about 1 cm diameter areas. The encapsulating material was then allowed to air dry. The thickness of the dried encapsulating resin was about 0.25 mm. The resulting composite layer comprising the conformal-coated microstructured-layer and the encapsulating material was delaminated from the aluminum foil surface by peeling the aluminum foil away from the composite layer. Delamination appeared to be 100%.

EXAMPLE 5

The (delaminated) composite layer of Example 5 was prepared as described in Example 4 except the encapsulating material was a rubber adhesive resin (commercially available under the trade designation "ADHESIVE 847" from the 3M Company) and the adhesive was cured by air drying at room temperature.

Delamination of the composite layer appeared to be 100%, although delamination was somewhat more difficult than for the more rigid composite layers described in Examples 2, 3, 4, 7, 8, 9, 10, 11, and 14.

EXAMPLE 6

A polyimide film (commercially available under the trade designation "NOVAL" from Mitsubishi Chemical Industries Ltd. of Tokyo, Japan) having a thickness of 0.05 mm (2 mils) was stretch-mounted in stainless steel rings, to form an 8.9 mm diameter disc, cleaned (as described in Example 2) and sputter-coated with about a 100 nm layer of copper (as described in Example 4). A microstructured-layer of perylene red was formed onto the copper-coated surface as described in Example 1. The microstructured-layer was then sputtered coated with Fe to provide a conformal coating of Fe having a planar equivalent thickness of about 210 nm.

Three milliliters of adhesive (DUCO CEMENT) were uniformly applied to the 8.9 diameter disc by spin coating at about 560 rpm for about 3 seconds. The adhesive was allowed to air dry at room temperature. The copper-coated polyimide film was easily peeled away from the resulting composite layer comprising the conformal-coated microstructured-layer and the adhesive.

EXAMPLES 7-11

Examples 7-11 illustrate the use of radiation curable materials as encapsulants.

EXAMPLE 7

Several drops of a UV curable optical adhesive (commercially available under the trade designation "NOA 68" from Norland Products, Inc. of New Brunswick, N.J.) were applied to a CoCr-coated microstructured-layer of perylene red prepared as described in Example 2. Each drop of adhesive was allowed to wet out to its self-determined thickness. The adhesive was cured in a flowing nitrogen atmosphere under UV lamps (commercially available under the trade designation "LIGHT-CAST II" from Merck, Sharp & Dohme Orthopedics, Co. of West Point, Pa.) for about 1 hour. The resulting composite comprising the adhesive and the CoCr-coated microstructured-layer were delaminated from the aluminum foil. Delamination appeared to be about 100%.

Thickness of the composite layer varied from about 0.125 to about 0.875 mm.

A SEM of a freeze fracture prepared sample of the composite layer taken at a 45 degree angle at about 15,000X showed that the microstructured-layer was embedded at the surface of the composite layer, essentially perpendicular to the original substrate (i.e., aluminum foil) interface.

EXAMPLE 8

A CoCr-coated microstructured-layer of perylene red was prepared as described in Example 2. About 0.5 ml of an uncured photopolymer comprising one part cyclohexyl methacrylate (commercially available under the trademarked designation "SARTOMER 208 MONOMER" from Sartomer Co , Inc. of Westchester, Pa.) to one part of a casting composition prepared as disclosed in Example 11 of U.S. Pat. No. 4,785,064, the disclosure of which is incorporated herein by reference, except that one mole of pentaerythritol triacrylate and two moles of 2-hydroxyethyl methacrylate were used instead of the two moles of pentaerythritol triacrylate and one mole of 2-hydroxyethyl methacrylate, photopolymer, were spin-coated at about 950 rpm onto a triangular shaped piece (2.5 cm long sides) of the CoCr-coated microstructured-layer. The photopolymer was cured as described in Example 7 for about 30 minutes. The resulting composite layer comprising the cured photopolymer and the CoCr-coated microstructured-layer was separated from the aluminum foil by immersing the composite layer-substrate in liquid nitrogen and then peeling the composite away Delamination appeared to be 100%.

The delaminated surface of the composite layer was metallic-green. The opposite side of the composite layer (i.e., the cured photopolymer) was shiny and black.

EXAMPLE 9

A microstructured-layer of perylene red was formed on a copper-coated polyimide film as described in Example 6. The microstructured-layer was sputter-coated with CoCr as described in Example 2 to provide a conformal CoCr coating having an equivalent planar thickness of about 125 nanometers. An uncured photopolymer (described in Example 8, above) was coated onto the microstructured-layer, cured, and the resulting composite layer delaminated as described in Example 8. Again, delamination appeared to be 100%.

EXAMPLE 10

A microstructured-layer of perylene red having a conformal coating of Fe was prepared as described in Example 3. About 6 ml of a photopolymer (prepared as described in Example 6 of U.S. Pat. No. 4,510,593 the disclosure of which is incorporated herein by reference) were poured onto the conformal-coated microstructured-layer and gently rocked to cause the photopolymer to uniformly distribute itself over the sample. The photopolymer was cured as described in Example 7 for about 30 minutes.

The aluminum foil was easily peeled away from the resulting composite layer comprising the conformal-coated microstructured-layer and the cured photopolymer. Delamination of the microstructured-layer from the aluminum foil appeared to be 100%.

EXAMPLE 11

A microstructured-layer of perylene red having a conformal coating (250 nanometer planar equivalent thickness) of CoCr was prepared as described in Example 9. A photopolymer (prepared as described in Examples 1 and 2 of U.S. Pat. No. 4,262,072, the disclosure of which is incorporated herein by reference) was applied to the conformal-coated microstructured-layer and cured as described in Example 10.

The composite layer comprising the conformal-coated microstructured-layer and the cured photopolymer was delaminated from the copper-coated polyimide film as follows. About 5 ml of an acid-based UV curable adhesive, comprising 90% isooctyl acrylate at 10% acrylic acid (prepared as described for composition 1 in Examples 1-17 of U.S. Pat. No. 4,181,752, which is incorporated herein by reference) was blended with about 0.27 percent by weight of 1,6-hexanediol diacrylate (based on the weight of the 5 ml of the acid-based UV curable adhesive) and about 0.2 percent by weight of 2,2-dimethoxy-2-phenylacetophenone (commercially available under the trademarked designation "IRGACURE" from Ciba-Geigy Corp. of Summit, N.J.), and applied to the exposed surface of the cured photopolymer in a circular stripe midway between the center and edge of the sample. A 15 cm diameter piece of surface primed polyester having a thickness of 0.1 mm was placed primed side down onto the adhesive-coated surface of the composite. The polyester film was flattened to distribute the adhesive evenly over the exposed surface of the composite layer. The adhesive was UV cured for 55 minutes as described in Example 7. The resulting composite comprising the conformal-coated microstructured-layer, the cured photopolymer, the cured acid-based photocurable prepolymer adhesive, and the surface primed polyester were delaminated from the copper-coated polyimide film. Delamination appeared to be 100%.

EXAMPLE 12

A microstructured-layer of perylene red was deposited onto an 8.9 cm diameter polished steel disc electroplated with nickel, using the method described in Example 1 for depositing a microstructured-layer onto copper-coated glass. The microstructured-layer was sputter-coated with CoCr as described in Example 2 to provide a conformal coating of CoCr having an equivalent planar thickness of 200 nm.

A thin layer of a polymer (prepared as disclosed in Example 4 of U.S. Pat. No. 4,986,496, the disclosure of which is incorporated herein by reference) was applied to the conformal-coated surface by spin coating about 1.5 ml of the photopolymer at about 3000 rpm for about 1 minute The photopolymer was UV cured in flowing nitrogen gas for about 30 minutes using the UV lamps described in Example 7. The composite layer comprising the conformal-coated microstructured-layer and cured photopolymer was delaminated from the nickel-plated disc using the delamination technique described in Example 11. Delamination appeared to be 100%.

EXAMPLE 13

A microstructured-layer of perylene red was deposited on aluminum foil as described in Example 2, except the organic layer comprising perylene red was coated onto the aluminum foil maintained at about 200° C. at a rate of about 0.25 nm/second and the organic layer was not annealed after it was coated onto the aluminum foil. The resulting microstructured-layer comprised randomly oriented whiskers which were larger in size than the whiskers comprising the microstructured-layer of Example 2.

The microstructured-layer was sputter-coated with CoCr as described in Example 2 to provide a conformal coating of CoCr having an equivalent planar thickness of about 125 nm.

About 3 drops of the UV curable adhesive described in Example 11 were applied to a 2.5 cm×2.5 cm area of the conformal-coated microstructured-layer. The UV curable adhesive was distributed over the microstructured-layer by using a piece of polyester as described in Example 11. The UV curable adhesive was cured for about 20 minutes in flowing nitrogen gas using the UV lamps as described in Example 7.

The resulting composite layer comprising the conformal-coated microstructured-layer and the cured UV adhesive was delaminated from the polyester substrate by peeling the polyester away from the composite layer. Delamination appeared to be 100%.

EXAMPLE 14

A conformal-coated microstructured-layer was prepared as described in Example 2. The microstructured-layer of perylene red was sputter-coated with copper using the system described in Example 2 to provide a conformal coating of copper having an equivalent planar thickness of about 60 nm.

The conformal-coated microstructured-layer was coated with two drops of a two part epoxy (commercially available under the trade designation "5-MINUTE EPOXY" from Devcon Corp.) The epoxy was spread over the microstructured surface by hand.

The epoxy was allowed to cure in air at room temperature overnight. The resulting composite comprising the conformal-coated microstructured-layer and cured epoxy were delaminated from the aluminum foil by peeling the aluminum foil away from the composite layer. Delamination appeared to be 100%.

EXAMPLE 15

A microstructured-layer of perylene red was deposited onto a 9.5 cm diameter nickel-plated disc as described in Example 12. The microstructured-layer was sputter-coated with CoCr as described in Example 2 to provide a conformal coating of CoCr having an equivalent planar thickness of about 70 nm.

The nickel-plated disc having the conformal-coated microstructured-layer thereon was placed microstructured-layer side up in a 154 cm diameter glass dish and covered. The covered dish was heated to about 158° C. on a hot plate with a flow of nitrogen gas passing through the covered dish.

When the temperature of the disc reached about 158° C., about 50 cubic pellets (3 to 4 mm per side) of a polyester material (commercially available under the trade designation "VITEL PE200 POLYESTER" from Goodyear Tire and Rubber Co. of Atlanta, Ga.) were placed on the conformal-coated microstructured-layer. The polyester pellets melted into a pool approximately 3.5 cm in diameter. The disc was allowed to cool in air during which time the liquified polyester solidified. The resulting composite layer comprising the conformal-coated microstructured-layer and the solidified polyester overcoat were easily delaminated from the nickel-plated substrate by inserting a razor blade at the disc-microstructured-layer interface. The delaminated surface of the composite layer had a mirror-like metallic-bronze finish. Delamination appeared to be 100%.

EXAMPLE 16

A composite disc was prepared as described in Example 15 except about 18 small pellets, 2 to 4 mm per side, of bis phenol A polycarbonate were used in place of the polyester pellets, and liquification of the pellets was accomplished by heating the disc to about 200° C. The liquified bis phenol A polycarbonate solidified upon cooling. Delamination appeared to be 100%. The resulting composite layer provided a structure comprising conformal-coated microstructured-layer and solidified bis phenol A polycarbonate.

EXAMPLE 17

A composite disc was prepared as described in Example 15 except about 4 or 5 cubic pellets of a polycarbonate (commercially available under the trade designation "LEXAN 123-112 POLYCARBONATE" from General Electric of Cleveland, Ohio) were used in place of the polyester pellets, and liquification of the pellets was accomplished by heating the disc to about 200° C. The liquified polycarbonate solidified upon cooling. Delamination of the resulting composite layer provided a structure comprising a conformal-coated microstructured-layer and solidified polycarbonate. Delamination appeared to be 100%.

EXAMPLE 18

A composite disc was prepared as described in Example 15 except about 4 or 5 cubic pellets of poly(methylmethacrylate) were used in place of the polyester pellets, and liquification of the pellets was accomplished by heating the disc to about 200° C. The liquified poly (methylmethacrylate) solidified upon cooling. Delamination of the resulting composite layer provided a structure comprising a conformal-coated microstructured-layer and solidified poly(methylmethacrylate). Delamination appeared to be 100%.

EXAMPLE 19

This example illustrates the radiation absorbing ability of a composite article according to the present invention.

A microstructured-layer of perylene red was deposited onto a copper coated polyimide film as described in Example 6. The microstructured-layer was vacuum vapor-coated with gold to provide a conformal coating of gold having a planar equivalent thickness of about 2500 nm.

An adhesive (DUCO CEMENT) was applied to the conformal-coated, microstructured-layer as described in Example 6 to provide a composite cured thickness of about 0.06 mm.

The copper-coated polyimide film was easily peeled away from the resulting composite layer comprising the conformal-coated microstructured-layer and the adhesive.

The absolute reflectance and transmittance spectra of the delaminated composite layer were measured using a conventional W-Visible spectrophotometer over the wavelength range from 200 to 800 nm. The reflectance measurements were made in the specular mode (i.e., the angle of reflectance equals the angle of incidence), about 5 degrees off normal incidence. The transmission measurements were made with the composite article in close proximity to an integrating sphere so that there was an included angle for the detector of about 60 degrees from the normal to the delaminated surface of the composite layer. The measured reflectance was less than or equal to about 1.6% over the 200 to 800 nm wavelength range. The measured transmittance was less than or equal to about 0.3% over the 200 to 800 nm wavelength range. The results show that the composite layer absorbs over 98% of incident radiation having a wavelength in the range from about 200 to about 800 nm.

Various modifications and alterations of this invention will become apparent to those skilled in the art without departing from the scope and spirit of this invention, and it should be understood that this invention is not to be unduly limited to the illustrative embodiments set forth herein.

I claim:

1. A composite article comprising a layer having a dense array of discrete microstructures partially encapsulated therein by an encapsulant, wherein one distal end of each of said microstructures is exposed, wherein said exposed distal ends of said microstructures and a surface of said layer are on a common side of said layer, said microstructures are selected from the group consisting of organic microstructures and inorganic semiconductor microstructures, and said microstructures have a mean diameter in the range from about 1 to about 5000 nanometers, said discrete microstructures being formed on a surface of a substrate, said substrate having a surface topography, and said exposed distal ends of said microstructures, which have been delaminated from said substrate, form a surface topography that is the inverse of said surface topography of said substrate.

2. The composite article according to claim 1 wherein said exposed distal ends of said microstructures and said surface of said layer are on a common plane.

3. The composite article according to claim 1 wherein each of said microstructures are monocrystalline.

4. The composite article according to claim 1 wherein each of said microstructures comprises polycrystalline regions.

5. The composite article according to claim 1 wherein said dense array of said microstructures are randomly oriented.

6. The composite article according to claim 1 wherein said dense array of said microstructures are oriented such that their major axes are parallel to each other.

7. The composite article according to claim 1 wherein said microstructures are essentially uniform in size and shape.

8. The composite article according to claim 1 wherein said microstructures have an aspect ratio which ranges from about 3:1 to about 100:1.

9. The composite article according to claim 1 further comprising a conformal coating interposed between said microstructures and said encapsulant.

10. The composite article according to claim 9 wherein said conformal coating comprises a material selected from the group consisting of an organic material and an inorganic material.

11. The composite layer according to claim 10 wherein said inorganic material is selected from the group consisting of metal oxides, metal sulfides, metal chlorides, metal carbides, metal borides, metal nitrides, metal silicides, and metals.

12. The composite article according to claim 10 wherein said organic material is a polymeric material.

13. The composite article according to claim 1 wherein said microstructures have an areal number density in the range from about 0.04 to about $10^6$ microstructures per square micrometer.

14. The composite article according to claim 1 wherein said microstructures have an areal number density in the range from about 1 to about $10^4$ microstructures per square micrometer.

15. The composite article according to claim 1 wherein said organic microstructures are made of an organic material comprising planar molecules and chains or rings over which $\pi$-electron density is delocalized.

16. The composite article according to claim 15 wherein said organic material is a polymeric material.

17. The composite article according to claim 15 wherein said organic material is selected from the group consisting of polynuclear aromatic hydrocarbons and heterocyclic aromatic compounds.

18. The composite article according to claim 17 wherein said polynuclear aromatic hydrocarbons are selected from the group consisting of naphthalenes, phenanthrenes, perylenes, phenyls, anthracenes, coronenes, and pyrenes.

19. The composite article according to claim 17 wherein said heterocyclic aromatic compounds are selected from the group consisting of phthalocyanines, porphyrins, carbazoles, purines, and pterins.

20. The composite article layer according to claim 2 wherein said organic material is N,N'-di(3,5-xylyl)perylene-3,4,9,10 bis(dicarboximide).

21. The composite article according to claim 15 wherein said organic material is metal-free phthalocyanine.

22. The composite article according to claim 1 wherein said inorganic semiconductor microstructures are made from a material selected from the group consisting of diamond, germanium, selenium, arsenic, silicon, tellurium, gallium arsenide, gallium antimonide, gallium phosphide, aluminum antimonide, indium antimonide, indium tin oxide, zinc antimonide, indium phosphide, aluminum gallium arsenide, zinc telluride, and combinations thereof.

23. The composite article according to claim 1 wherein said encapsulant is selected from the group consisting of an organic material and an inorganic material.

24. The composite article according to claim 23 wherein said inorganic material is selected from the group consisting of metal oxides, metal sulfides, metal chlorides, metal carbides, metal borides, metal nitrides, metal chlorides, metal silicides, and metals.

25. The composite article according to claim 23 wherein said organic material is a polymeric material.

26. The composite article according to claim 1 wherein said microstructures form one of a repeating or nonrepeating pattern.

27. The composite article according to claim 1 wherein said microstructures are regularly arrayed.

28. The composite article according to claim 1 wherein said microstructures are oriented such that their major axes are perpendicular to said surface of said layer.

29. The composite article according to claim 1 wherein said microstructures are uniformly oriented and are perpendicular to said surface of said layer.

30. A composite article comprising a layer having a dense array of discrete, regularly arrayed, organic microstructures partially encapsulated therein by an encapsulant, wherein one distal end of each of said microstructures is exposed, wherein said exposed distal ends of said microstructures and a surface of said layer are on a common side of said layer, said discrete microstructures being formed on a surface of a substrate, said substrate having a surface topography, and said exposed distal ends of said microstructures, which have been delaminated from said substrate, form a surface topography that is the inverse of said surface topography of said substrate.

31. The composite article according to claim 30 further comprising a conformal coating interposed between said microstructures and said encapsulant.

32. The composite article according to claim 30 wherein said microstructures are uniformly oriented and are perpendicular to said surface of said layer.

33. A composite article comprising a layer having a dense array of discrete organic microstructures partially encapsulated therein by an encapsulant, wherein one distal end of each of said microstructures is exposed, wherein said exposed distal ends of said microstructures and a surface of said layer are on a common side of said layer, said microstructures are essentially uniform in size and shape, having an aspect ratio in the range from about 3:1 to about 100:1, and have a mean diameter in the range from about 1 to about 5000 nanometers, said discrete microstructures being formed on a surface of a substrate, said substrate having a surface topography, and said exposed distal ends of said microstructures, which have been delaminated from said substrate, form a surface topography that is the inverse of said surface topography of said substrate.

34. The composite article according to claim 33 further comprising a conformal coating interposed between said microstructures and said encapsulant.

35. The composite article according to claim 33 wherein said microstructures are uniformly oriented and are perpendicular to said surface of said layer.

36. A composite article comprising a layer having a dense array of discrete, organic microstructures partially encapsulated therein by an encapsulant, wherein one distal end of each of said microstructures is exposed, wherein said exposed distal ends of said microstructures and a surface of said layer are on a common side of said layer, and wherein interposed between said microstructures and said encapsulant is a conformal coating of an inorganic conformal coating material, said discrete microstructures being formed on a surface of a substrate, said substrate having a surface topography, and said exposed distal ends of said microstructures, which have been delaminated from said substrate, form a surface topography that is the inverse of said surface topography of said substrate.

37. The composite article according to claim 36 wherein said microstructures are regularly arrayed.

* * * * *

UNITED STATES PATENT AND TRADEMARK OFFICE
CERTIFICATE OF CORRECTION

PATENT NO.: 5,336,558

DATED: August 9, 1994

INVENTOR(S): Debe

It is certified that error appears in the above-identified patent and that said Letters Patent is hereby corrected as shown below:

Col. 4, line 58, "(e g, " should be --(e.g., --.

Col. 14, line 61, "alelaminated" should be --delaminated--.

Col. 21, line 14, "W-Visible" should be --UV-Visible--.

Signed and Sealed this

Second Day of January, 1996

Attest:

BRUCE LEHMAN

*Attesting Officer*       Commissioner of Patents and Trademarks